(12) United States Patent
Oh et al.

(10) Patent No.: US 12,546,534 B2
(45) Date of Patent: Feb. 10, 2026

(54) SUBSTRATE TREATING APPARATUS

(71) Applicant: SEMES CO., LTD., Chungcheongnam-do (KR)

(72) Inventors: Seung Hoon Oh, Chungcheongnam-do (KR); Ji Hyeong Lee, Chungcheongnam-do (KR); Jin Se Park, Chungcheongnam-do (KR); Yong Joon Im, Gyeonggi-do (KR); Young Hun Lee, Chungcheongnam-do (KR); Yong Sun Ko, Gyeonggi-do (KR)

(73) Assignee: SEMES CO., LTD., Chungcheongnam-do (KR)

( * ) Notice: Subject to any disclaimer, the term of this patent is extended or adjusted under 35 U.S.C. 154(b) by 595 days.

(21) Appl. No.: 18/099,388

(22) Filed: Jan. 20, 2023

(65) Prior Publication Data
US 2024/0142171 A1    May 2, 2024

(30) Foreign Application Priority Data
Oct. 27, 2022    (KR) .................. 10-2022-0139812

(51) Int. Cl.
*F26B 5/00* (2006.01)
*F26B 21/10* (2006.01)
(Continued)

(52) U.S. Cl.
CPC .............. *F26B 5/005* (2013.01); *F26B 21/10* (2013.01); *F26B 25/003* (2013.01); *F26B 25/16* (2013.01); *G03F 7/168* (2013.01)

(58) Field of Classification Search
CPC ........ F26B 5/005; F26B 21/10; F26B 25/003; F26B 25/16; F26B 5/00; F26B 5/08;
(Continued)

(56) References Cited

U.S. PATENT DOCUMENTS 8,944,078 B2    2/2015    Kamikawa
9,449,857 B2    9/2016    Inadomi
(Continued)

FOREIGN PATENT DOCUMENTS

KR    10-2011-0112195    10/2011
KR    10-2013-0138116    12/2013
(Continued)

OTHER PUBLICATIONS

Notice of Allowance dated Nov. 25, 2024 for Korean Patent Application No. 10-2022-0139812 and its English translation by Google Translate.
(Continued)

*Primary Examiner* — David J Laux
(74) *Attorney, Agent, or Firm* — WOMBLE BOND DICKINSON (US) LLP

(57) ABSTRACT

A substrate treating apparatus of the present disclosure comprises: a chamber member having an accommodation space configured to accommodate a vessel part where a substrate treatment region constituting a supercritical treatment space are formed, and an opening configured to move the substrate inside or outside; a shutter configured to open or close the chamber member; and a first exhaust part configured to discharge an internal air from the accommodation space to the outside, wherein the temperature of the substrate treatment region is increased.

17 Claims, 5 Drawing Sheets

(51) Int. Cl.
*F26B 25/00* (2006.01)
*F26B 25/16* (2006.01)
*G03F 7/16* (2006.01)

(58) Field of Classification Search
CPC ... G03F 7/168; G03F 7/32; G03F 7/40; G03F 7/427; H01L 21/67034; H01L 21/67017; H01L 21/6719; H01L 21/67126; H01L 21/67173; H01L 21/67742
See application file for complete search history.

(56) References Cited

U.S. PATENT DOCUMENTS

| | | | |
|---|---|---|---|
| 2016/0336201 A1 | 11/2016 | Inadomi | |
| 2018/0138058 A1 | 5/2018 | Egashira et al. | |
| 2020/0219736 A1* | 7/2020 | Aoki | H01L 21/67742 |
| 2022/0090859 A1* | 3/2022 | Yoon | F26B 21/14 |
| 2022/0165599 A1* | 5/2022 | Kawahara | B08B 3/08 |
| 2022/0199440 A1* | 6/2022 | Kim | H01L 21/67748 |
| 2022/0208561 A1* | 6/2022 | Lee | H01L 21/67017 |

FOREIGN PATENT DOCUMENTS

| | | |
|---|---|---|
| KR | 10-2014-0047643 | 4/2014 |
| KR | 10-2018-0054452 | 5/2018 |
| KR | 10-2019-0038346 | 4/2019 |
| KR | 10-2020-0139633 | 12/2020 |
| KR | 10-2022-0095350 | 7/2022 |

OTHER PUBLICATIONS

Office Action dated Mar. 14, 2024 in Korean Patent Application No. 10-2022-0139812, and its English machine translation by Global Dossier.

* cited by examiner

[FIG. 1]
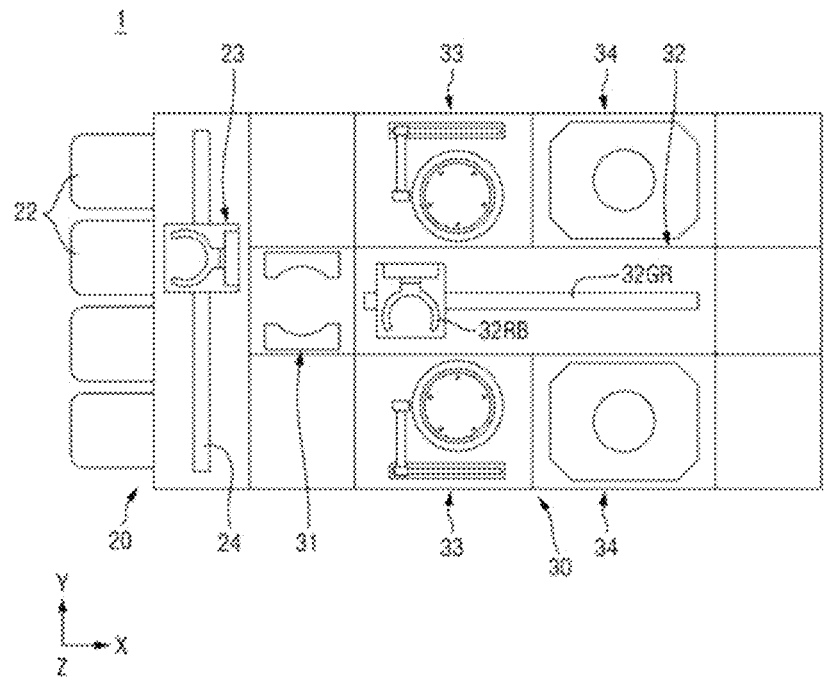
[FIG. 2]
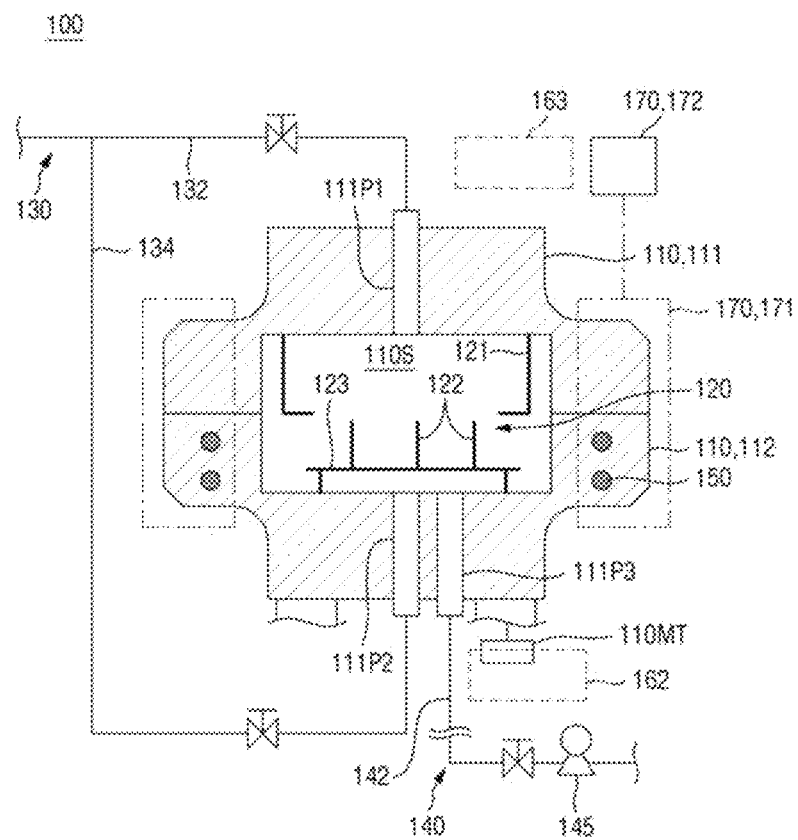

[FIG. 3]
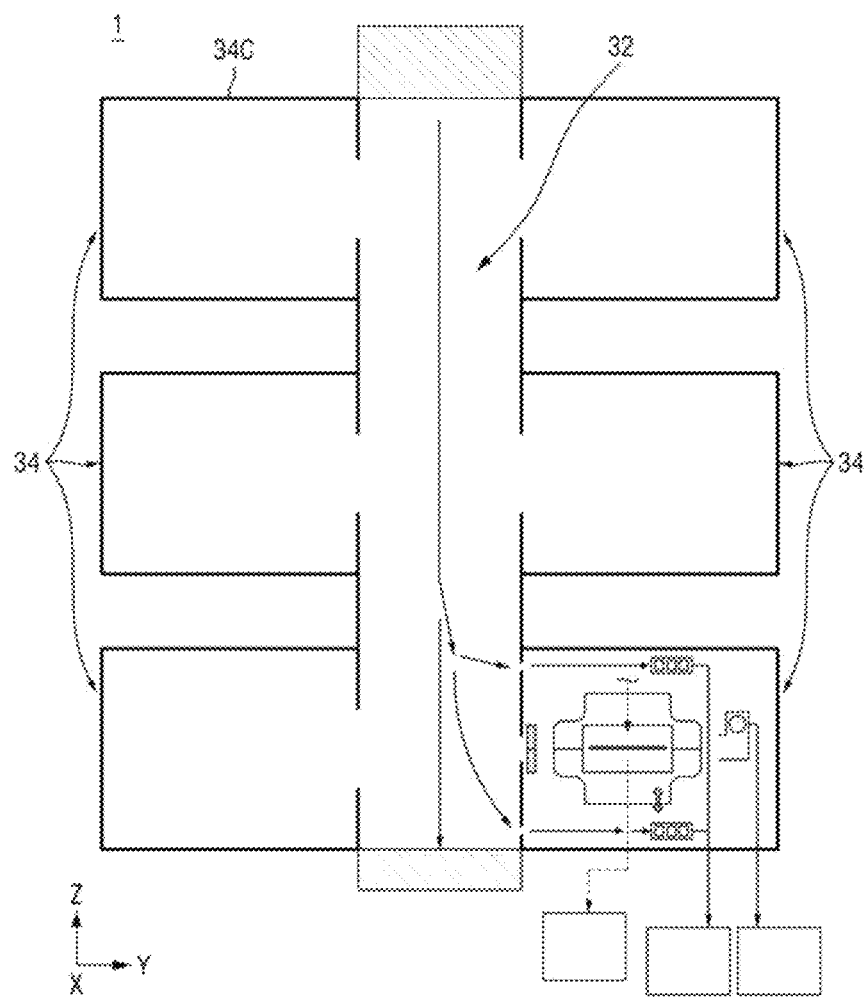

[FIG. 4]
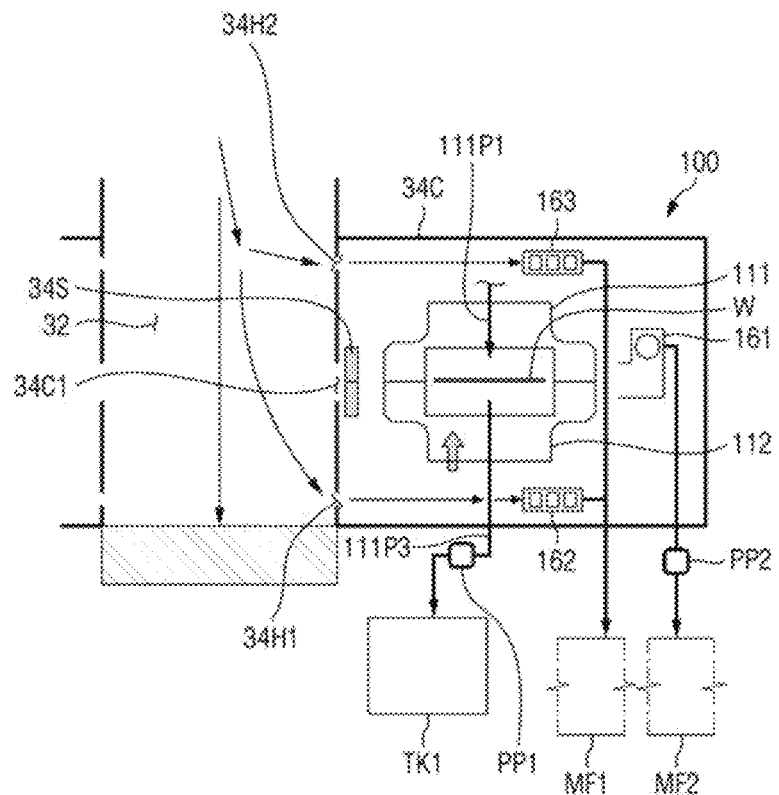
[FIG. 5]
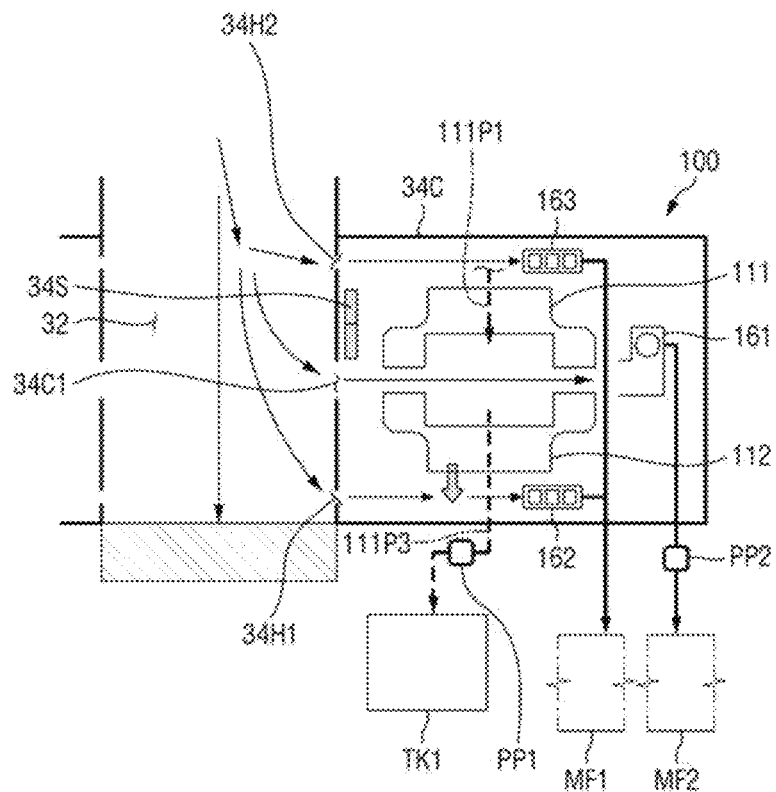

[FIG. 6]
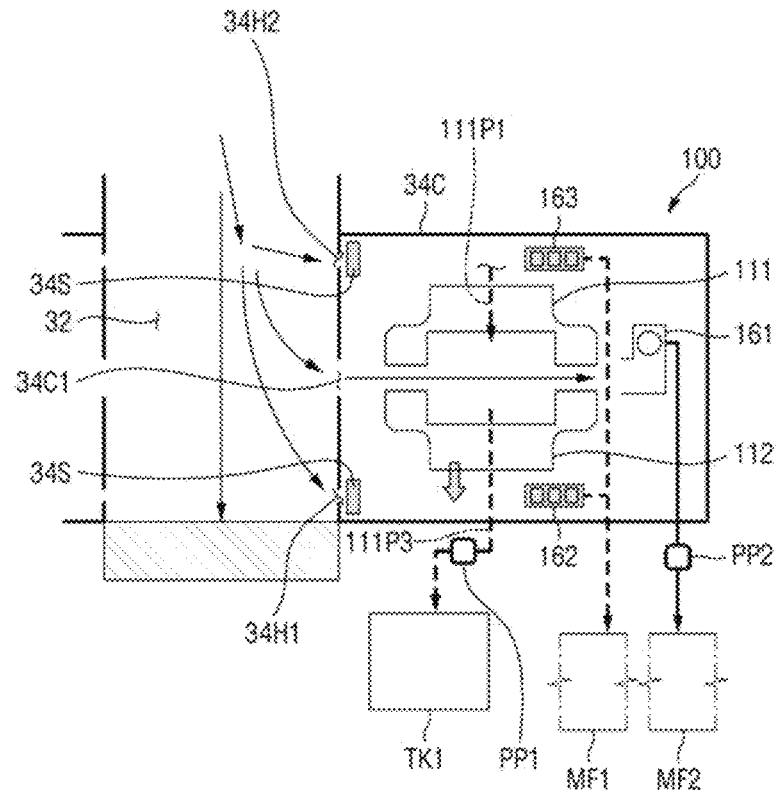
[FIG. 7]
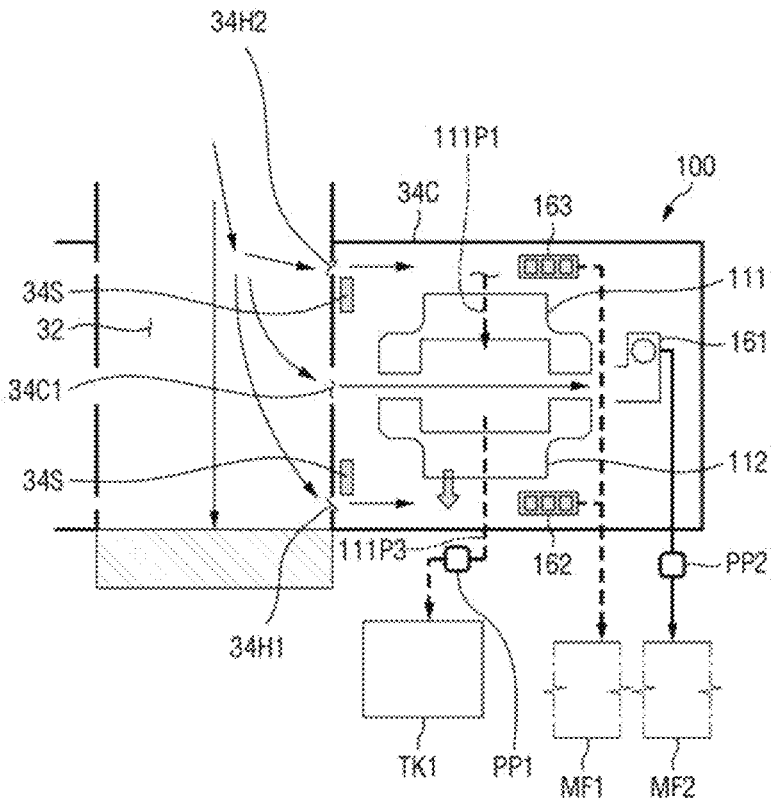

[FIG. 8]
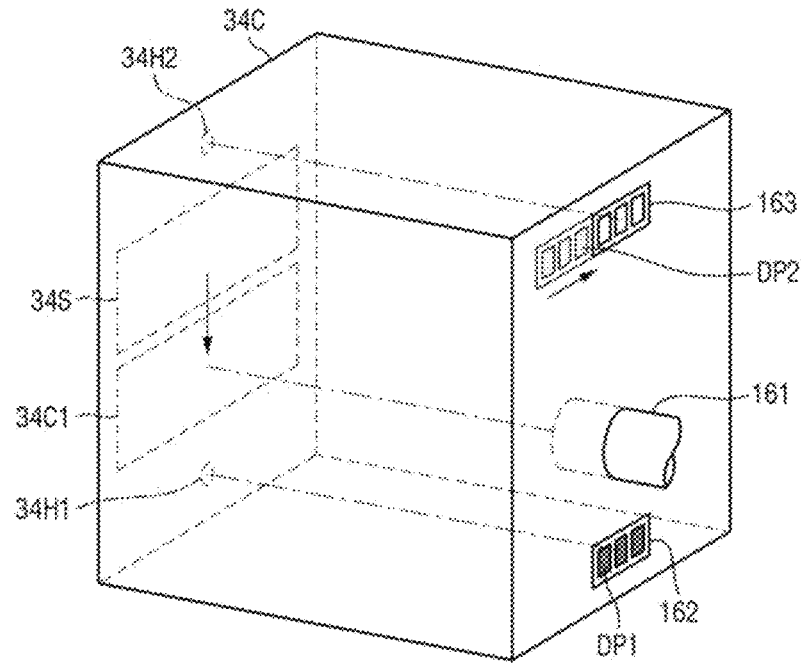
[FIG. 9]
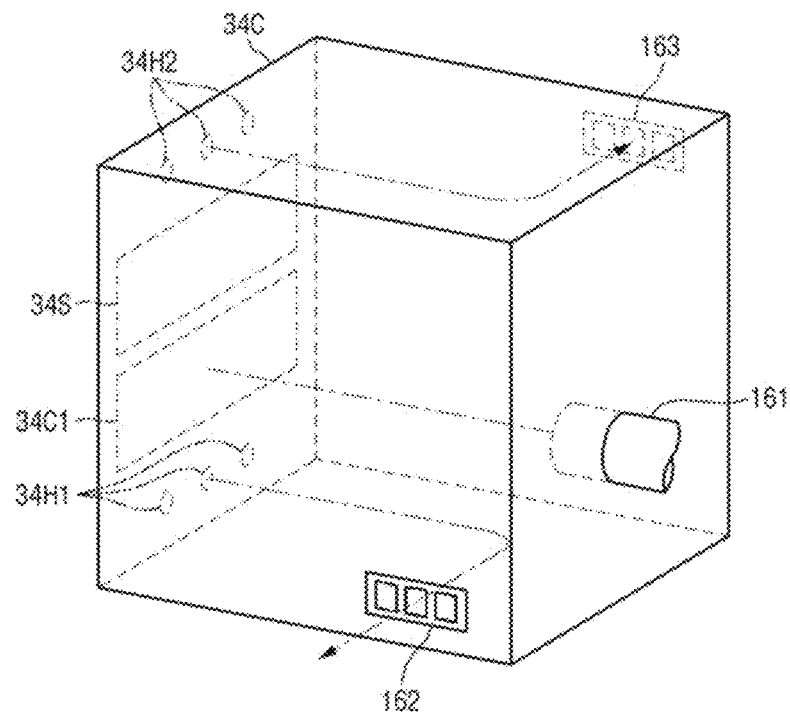

SUBSTRATE TREATING APPARATUS

CROSS-REFERENCE TO RELATED APPLICATION

This application claims priority from Korean Patent Application No. 10-2022-0139812 filed on Oct. 27, 2022 in the Korean Intellectual Property Office, and all the benefits accruing therefrom under 35 U.S.C. 119, the contents of which in its entirety are herein incorporated by reference.

BACKGROUND

1. Technical Field

The present disclosure relates to a substrate treating apparatus.

2. Description of the Related Art

In order to manufacture a semiconductor device, various processes such as deposition, photography, etching, and cleaning are performed. Among them, the photographic process includes a coating process, an exposure process, and a developing process. The coating process involves coating a photosensitive liquid such as a photoresist on a substrate. The exposure process involves exposing a circuit pattern on the substrate by exposing light from a light source through a photomask on the coated photoresist film. Finally, the developing process includes selectively developing an exposed area of the substrate.

The developing process includes a developer supply step, a rinsing liquid supply step, and a drying step. In the drying step, a spin chuck configured to support the substrate is rotated, and spin drying is performed to dry the developer or the rinsing liquid remaining on the substrate using a centrifugal force applied by the spin chuck to the substrate.

In recent years, with the miniaturization of a critical dimension (CD) between the pattern and the pattern formed on the substrate, a leaning phenomenon occurs which collapses or bends the pattern when the aforementioned spin drying is performed. Accordingly, a drying device using a supercritical fluid is introduced.

SUMMARY

Meanwhile, in a supercritical drying apparatus, since the pressure and temperature of a vessel part have to be higher than normal pressure and room temperature, a substrate is treated in a sealed space. When an external air (room temperature) is introduced into a chamber under this condition, the crowding of particles may occur due to the temperature difference between an inlet and the inside. Accordingly, there is a need for improvement.

Aspects of the present disclosure provide a substrate treating apparatus which can reduce a temperature difference of the chamber and optimize an airflow for a process.

The technical aspects of the present disclosure are not restricted to those set forth herein, and other unmentioned technical aspects will be clearly understood by one of ordinary skill in the art to which the present disclosure pertains by referencing the detailed description of the present disclosure given below.

Technical Solution

According to an aspect of the present disclosure, there is provided a substrate treating apparatus comprising: a chamber member including an accommodation space and an opening configured to move a substrate into and out of the accommodation space, wherein a vessel part having a substrate treatment region formed for treating the substrate using a supercritical fluid is installed in the accommodation space; a shutter configured to open or close the opening of the chamber member; and a first exhaust part configured to discharge an internal air from the accommodation space to the outside; and wherein during the treatment of the substrate using the supercritical fluid in the vessel part, the shutter closes the opening.

According to another aspect of the present disclosure, there is provided a substrate treating apparatus comprising: a transport chamber provided with a transport robot configured to carry in or out a substrate; a chamber member disposed adjacent to the transport chamber, including an accommodation space and an opening configured to move the substrate into and out of the accommodation space, wherein a vessel part having a substrate treatment region formed for treating the substrate using a supercritical fluid is installed in the accommodation space; and a shutter configured to open or close the opening of the chamber member; wherein during the treatment of the substrate using the supercritical fluid in the vessel part, the shutter closes the opening.

According to another aspect of the present disclosure, there is provided a substrate treating apparatus comprising: a transport chamber provided with a transport robot configured to carry in or out a substrate; a chamber member disposed adjacent to the transport chamber, including an accommodation space and an opening configured to move the substrate into and out of the accommodation space, a vessel part provided in the accommodation space and having a substrate treatment region formed as a supercritical treatment space by coupling an upper body and a lower body of thereof; a shutter configured to open or close the opening of the chamber member; a fluid supply unit configured to supply a treating fluid to the substrate treatment region; an exhaust unit configured to exhaust the treating fluid from the substrate treatment region; a first exhaust part configured to discharge an internal air from the accommodation space to the outside and face the opening and the substrate treatment region at the same height; a first driving part configured to move one of the upper body and the lower body relative to the other body; a second exhaust part disposed adjacent to the first driving part and configured to exhaust the internal air around the first driving part to the outside; a clamping module including a clamp configured to clamp a circumference of the vessel part, and a second driving part configured to drive a clamping release and a clamping operation of the clamp; a third exhaust part disposed adjacent to the second driving part and configured to exhaust the internal air around the second driving part to the outside. The chamber member comprises: a first suction part formed in the shape of a penetrating hole or a slit at the same height as the second exhaust part; and a second suction part formed in the shape of the penetrating hole or the slit at the same height as the third exhaust part. The first suction part, the second suction part and the opening part are provided in a vertical line. The treating fluid forms a supercritical fluid in the fluid supply unit and is then supplied, or forms the supercritical fluid by controlling pressure and temperature in the substrate treatment region. During the treatment of the substrate using the supercritical fluid in the vessel part, the shutter closes the opening, and an external air from the opened first and second suction parts is discharged to the outside through one of the first to third exhaust parts along with the internal air of the accommodation space.

Specific details of other embodiments are included in the detailed description and the drawings.

BRIEF DESCRIPTION OF THE DRAWINGS

The above and other aspects and features of the present disclosure will become more apparent by describing in detail exemplary embodiments thereof with reference to the attached drawings, in which:

FIG. 1 is a view illustrating a substrate treating apparatus according to some embodiments of the present disclosure;

FIG. 2 is a view illustrating the inside of a supercritical chamber of the substrate treating apparatus according to some embodiments of the present disclosure;

FIG. 3 is a view illustrating the substrate treating apparatus according to a first embodiment of the present disclosure;

FIG. 4 is a view illustrating a state in which a shutter of the substrate treating apparatus is closed according to a first embodiment of the present disclosure;

FIG. 5 is a diagram illustrating a state in which the shutter of a substrate treating apparatus is opened according to a first embodiment of the present disclosure;

FIG. 6 is a view illustrating the substrate treating apparatus according to a second embodiment of the present disclosure;

FIG. 7 is a view illustrating the substrate treating apparatus according to a third embodiment of the present disclosure;

FIG. 8 is a view illustrating a chamber member according to the first embodiment of a substrate treating apparatus according to some embodiments of the present disclosure; and FIG. 9 is a view illustrating the chamber member according to a second embodiment of a substrate treating apparatus according to some embodiments of the present disclosure.

DETAILED DESCRIPTION OF THE EMBODIMENTS

Hereinafter, embodiments of the present disclosure will be described with reference to the attached drawings. The merits and characteristics of the present disclosure and a method for achieving the merits and characteristics will become more apparent from the embodiments described in detail in conjunction with the accompanying drawings. However, the present disclosure is not limited to the disclosed embodiments, but may be implemented in various different ways. The embodiments are provided to only complete the disclosure of the present disclosure and to allow those skilled in the art to understand the category of the present disclosure. The present disclosure is defined by the category of the claims. Like numbers refer to like elements throughout the description of the figures.

The terminology used herein is for the purpose of describing particular embodiments only and is not intended to be limiting of the disclosure. In this specification, the singular also includes the plural unless specifically stated otherwise in the phrase. As used herein, "comprises" and/or "comprising" refers to the presence of one or more other components, steps, operations and/or elements. Or does not exclude additions.

FIG. 1 is a view illustrating a substrate treating apparatus according to some embodiments of the present disclosure.

Referring to FIG. 1, the substrate treating apparatus 1 can simply include an index module 20 and a treating module 30. For example, the index module 20 and the treating module 30 may be arranged in a line along an X-axis direction.

The index module 20 may transport a substrate W to the treating module 30 from a container (not shown) where the substrate W is accommodated, and may accommodate the treated substrate W in the container. For example, the index module 20 may include a load port 22 and an index robot 23. The container where the substrate W is accommodated may be placed in the load port 22. The index robot 23 can be moved along a guide rail 24 provided in the Y-axis direction.

The treating module 30 may include a buffer chamber 31, a transport chamber 32, a wet treating chamber 33, and a supercritical chamber 34.

The buffer chamber 31 may be provided between the index module 20 and the transport chamber 32. However, the present disclosure is not limited thereto. The buffer chamber 31 may store a plurality of substrates W together. The substrate W stored in the buffer chamber 31 may be carried in or out by the index robot 23 and a transport robot 32RB.

The transport chamber 32 may transport the substrate W between the wet treating chamber 33 and the supercritical chamber 34. The longitudinal direction of the transport chamber 32 may be provided in parallel with the X-axis direction. The transport robot 32RB may be provided in the transport chamber 32. The transport robot 32RB may have a hand on which the substrate W is placed. A guide rail 32GR whose longitudinal direction is provided in parallel with the X-axis direction may be provided in the transport chamber 32, and the transport robot 32RB can be moved on the guide rail 32GR.

In addition, the transport chamber 32 may be provided with a fan filter unit (not shown) so as to perform ventilation by driving a fan. In that case, the air in the transport chamber 32 may be introduced into the supercritical chamber 34 (see FIG. 3).

The wet treating chamber 33 may treat a liquid film on the substrate W. For instance, the wet treating chamber 33 may perform a cleaning process on the substrate W and clean a pattern surface of the substrate W. As a treating liquid discharged from the wet treating chamber 33 is a cleaning liquid, it may include a chemical, pure water (DIW), and an organic solvent. The organic solvent may include isopropyl alcohol (IPA).

The supercritical chamber 34 may be provided adjacent to the wet treating chamber 33. The supercritical chamber 34 may treat the substrate W by supplying a supercritical fluid to the substrate W. For example, the supercritical chamber 34 may dry the substrate W by supplying the supercritical fluid to the substrate W treated in the wet treating chamber 33. In other words, the supercritical chamber 34 may dry the organic solvent remaining on the substrate W.

Hereinafter, the substrate treating apparatus 100 that performs supercritical drying in the supercritical chamber 34 will be described with reference to the drawings.

FIG. 2 is a view illustrating the inside of a supercritical chamber of the substrate treating apparatus according to some embodiments of the present disclosure, and FIG. 3 is a view illustrating the substrate treating apparatus according to a first embodiment of the present disclosure. Furthermore, FIGS. 4 and 5 are views illustrating an operation state of a shutter of the substrate treating apparatus according to a first embodiment of the present disclosure. FIG. 8 is a view illustrating a chamber member according to the first embodiment of the substrate treating apparatus according to some embodiments of the present disclosure, and FIG. 9 is a view illustrating the chamber member according to a second embodiment of the substrate treating apparatus according to some embodiments of the present disclosure.

Referring to FIGS. 2 to 5, 8, and 9, the substrate treating apparatus 100 according to the first embodiment may include a vessel part 110, a substrate support unit 120, a fluid supply unit 130, an exhaust unit 140, a heating member 150, a first exhaust part 161, a second exhaust part 162, a third exhaust part 163, a clamping module 170, a chamber member 34C, and a shutter 34S.

Referring to FIG. 2, the vessel part 110 may provide a substrate treatment region 110S in which a drying process is performed. The vessel part 110 may have an upper body 111 provided at an upper part thereof and a lower body 112 provided at a lower part thereof, and the upper body 111 and the lower body 112 may be coupled to provide the substrate treatment region 110S.

One of the upper body 111 and the lower body 112 may be moved relative to the other body, which may be performed by a first driving part 110MT. For example, the position of the upper body 111 may be fixed, and the lower body 112 may ascend and descend by the first driving part 110MT. Herein, the first drive part 110MT may consist of, for instance, an actuator using pneumatic or hydraulic pressure, a linear motor operated by electromagnetic interaction, or a ball screw mechanism.

When the lower body 112 is spaced apart from the upper body 111, the substrate treatment region 110S is opened, and in that case, the substrate W may be carried in or out. During the process, the lower body 112 may get in close contact with the upper body 111 to seal the substrate treatment region 110S from the outside.

In addition, the vessel part 110 may include an upper supply port 111P1, a lower supply port 111p2, and an exhaust port 111p3. Herein, the upper supply port 111P1 may form a supply flow path of a treating fluid provided in the upper body 111, and the lower supply port 111p2 may form a supply flow path of the treating fluid provided in the lower body 112. The exhaust port 111p3 may form an exhaust flow path of the treating fluid provided in the lower body 112. The substrate support unit 120 may support the substrate W in the state where the substrate W is horizontal in the substrate treatment region 110S of the vessel part 110. The substrate support unit 120 may support a treated surface of the substrate W to face upwards. The substrate support unit 120 may include a first support member 121, a second support member 122, and a plate 123.

The first support member 121 and the second support member 122 may have different regions supporting the substrate W. The first support member 121 may support an edge region of the substrate W, while the second support member 122 may support a central region of the substrate W.

For example, the first support member 121 may extend downwards from the upper body 111 but may be bent towards the substrate W. The second support member 122 may be installed on the plate 123. For example, the plate 123 may be provided as a circular plate. The plate 123 may be disposed between the lower supply port 111p2 and the first support member 121.

The plate 123 may have a diameter covering both the lower supply port 111p2 and the exhaust port 111p3. Accordingly, the flow path of the treating fluid supplied from the lower supply port 111p2 may be bypassed by the plate 123. In other words, the plate 123 can prevent supercritical fluid (e.g., supercritical $CO_2$) supplied from the lower supply port 111p2 from being directly supplied to a non-treated surface of the substrate W.

The fluid supply unit 130 may supply the treating fluid, which is a fluid for supercritical drying, to the substrate treatment region 110S of the vessel part 110. For example, the treating fluid may be supplied to the substrate treatment region 110S in a supercritical state by a critical temperature and a critical pressure. However, the present disclosure is not limited thereto.

For example, the fluid supply unit 130 may include a storage tank (not shown) where the fluid is stored, an upper supply line 132, and a lower supply line 134. The upper supply line 132 may be connected to the upper supply port 111P1. The lower supply line 134 may be branched from the upper supply line 132 and connected to the lower supply port 111p2.

The treating fluid stored in the storage tank may be supplied to the substrate treatment region 110S through the upper supply line 132 and the lower supply line 134. A valve (not shown) can be provided in each of the upper supply line 132 and the lower supply line 134 to adjust a flow rate of the treating fluid.

The exhaust unit 140 may include an exhaust line 142 and an exhaust pump 145 (PP1). The exhaust line 142 can be connected to the exhaust port 111p3 provided in the lower body 112, thus exhausting the fluid from the substrate treatment region 110S to the outside (which may be a treatment tank TK1). A fluid exhaust may be performed by a pumping operation of the exhaust pumps 145 (PP1) provided on the exhaust line 142, but the present disclosure is not limited thereto.

The heating member 150 can heat the substrate treatment region 110S so that the substrate treatment region 110S can have or maintain the temperature required for the process. The heating member 150 may heat the supercritical fluid supplied to the substrate treatment region 110S above the critical temperature to maintain a supercritical fluid phase.

The heating member 150 may be embedded in a wall of the lower body 112 (or the upper body 111). For instance, the heating member 150 may receive power from the outside and provide the power to a heater configured to generate heat.

Referring to FIGS. 4, 8, and 9, the first exhaust part 161 may discharge an internal air from the accommodation space of the chamber member 34C to the outside. In addition, the first exhaust part 161 can discharge the internal air from the substrate treatment region 110S to the outside when the substrate treatment region 110S is opened by separating the upper body 111 and the lower body 112.

For instance, an inlet of the first exhaust part 161 may be provided on the same horizontal plane as an opening 34C1 so that the first exhaust part 161 is provided at a position opposite to the opening 34C1. In other words, the first exhaust part 161 and the opening 34C1 may be provided to face each other at the same height. Furthermore, the first exhaust part 161 may be disposed farthest from the opening 34C1 in the accommodation space of the chamber member 34C so that the formation of a dead zone is avoided or minimized behind the first exhaust part 161.

A pipe may be provided in the first exhaust part 161, and the pipe of the first exhaust part 161 may extend to the outside (which may be a second exhaust manifold MF2). Furthermore, the pipe of the first exhaust part 161 is provided with a fan and/or a pump PP2, thus forcing the internal air to be discharged from the accommodation space of the chamber member 34C. For instance, the first exhaust part 161 can be connected to the second exhaust manifold MF2, thus performing the final exhaust of the internal air of the accommodation space through the second exhaust manifold MF2. In addition, the final exhaust of the first exhaust part 161 may be treated in a separate tank (not shown) physically separated from the treatment tank TK1.

This is meant to prevent the airflow of the first exhaust part 161 from flowing back by the pressure of the treatment tank TK1 from which the supercritical fluid is exhausted. Although the present embodiment illustrates that the pump PP2 is provided upstream of the second exhaust manifold MF2, it may be provided downstream of the second exhaust manifold MF2, and a plurality of pumps may be provided, i.e., various modifications are possible.

In addition, although FIGS. 8 and 9 illustrate that the first exhaust part 161 has a pipe structure where the circumferential surface of the chamber member 34C is penetrated, the present disclosure is not limited thereto. As another example, various modifications such as a modification where the first exhaust part 161 may have a pipe structure where a bottom surface thereof is penetrated, or may have a structure similar to that of the second exhaust part 162 without the penetration of the pipe, are possible. Said differently, the first exhaust part 161 may have various structures that form exhaust.

The second exhaust part 162 may be disposed adjacent to the first driving part 110MT and exhaust the internal air around the first driving part 110MT to the outside. The second exhaust part 162 may be provided at a position shifted from the first exhaust part 161 in a vertical direction and/or in the left-right direction.

For example, when the actuator of the first driving part 110MT operates, dust may occur around the first driving part 110MT. The dust needs to be removed because it may act as particles in the accommodation space of the chamber member 34C. For instance, when the dust occurring in the first driving part 110MT moves to the first exhaust part 161 and is exhausted, the dust may be blocked by or attached to other components. Accordingly, in the present embodiment, the second exhaust part 162 may be provided adjacent to the first driving part 110MT so that the dust can be immediately removed from a short distance.

The second exhaust part 162 may be disposed at the same height as a first suction part 34H1. For instance, the second exhaust part 162 may be disposed to face the first suction part 34H1 at a position on the same line in the horizontal direction as the first suction part 34H1 (see FIG. 8). However, the present disclosure is not limited thereto. As another example, the second exhaust part 162 may be provided at the same height as the first suction part 34H1, but they may be provided at a position not facing each other (see FIG. 9).

In other words, the second exhaust part 162 and the first suction part 34H1 may be disposed on the same horizontal plane (i.e., the same height) so that the airflow of an external air introduced from the first suction part 34H1 is formed in the horizontal direction. The second exhaust part 162 is provided in an arrangement optimized for the position of the first driving part 110MT (i.e., the position closest to the second exhaust part 162 and the first driving part 110MT), and thus may not face the first suction part 34H1. Accordingly, various modifications are possible. This is similar to the arrangement relationship between a second suction part 34H2 and the third exhaust part 163.

The third exhaust part 163 may be provided at the same height as the second suction part 34H2. For instance, the third exhaust part 163 may be provided to face or not to face the second suction part 34H2 at a position on the same line in the horizontal direction as the second suction part 34H2.

The third exhaust part 163 may be disposed adjacent to the second driving part 172 and exhaust the internal air around the second driving part 172 to the outside (which may be a first manifold MF1). This is to ensure that the dust occurring in the second driving part 172 does not move to the first exhaust part 161 or the second exhaust part 162 and is immediately removed in a short distance. The second exhaust part 162 and the third exhaust part 163 may be provided with a pipe, a fan, and/or a pump, identically or similarly to the first exhaust part 161.

The exhaust of the second exhaust part 162 and the third exhaust part 163 may be finally exhausted through the first manifold MF1, and since the first manifold MF1 may be joined with the second exhaust manifold MF2, a pump may be omitted upstream of the first manifold MF1. However, various other variations are possible.

In addition, the internal air finally exhausted by the first exhaust part 161, the second exhaust part 162, and the third exhaust part 163 may be collected in a separate tank to avoid a discharge into the atmosphere. This is because an organic solvent on a liquid film-treated substrate W is made up of dangerous substances such as a carcinogen, which may cause problems when the internal air is discharged to the atmosphere.

The clamping module 170, which is meant to clamp the vessel part 110, may include a clamp 171 and a second driving part 172.

The clamp 171 may be provided in the form of a sanitary clamp configured to clamp the circumference of the vessel part 110. The sanitary clamp may form a penetrating hole so that both sides (i.e., edges) of the vessel part 110 are inserted, and clamp the circumference of the upper body 111 and the lower body 112.

The second driving part 172 may drive the clamping release and locking states of the clamp 171. For instance, the second driving part 172 may move the clamp 171 in the horizontal direction to enable the clamp 171 to clamp or unclamp the vessel part 110. The second driving part 172 may include a gear module and a motor. However, the present disclosure is not limited thereto. In addition, when the clamping module 170 is driven to generate dust nearby, the dust needs to be removed. The dust around the clamping module 170 may be exhausted by the third exhaust part 163 as described above.

A plurality of chamber members 34C be provided not only in the horizontal direction but also in the vertical direction so that a plurality of supercritical drying spaces are provided. However, the present disclosure is not limited thereto.

The chamber member 34C may form an accommodation space where the vessel part 110 is accommodated. In other words, the chamber member 34C may be provided to partition spaces such as the buffer chamber 31 and the wet treating chamber 33.

The chamber member 34C may form the opening 34C1 configured to move the substrate W inside or outside. The opening 34C1 may be configured to move the substrate W inside or outside and be formed on one surface of the chamber member 34C facing the transport chamber 32. The transport robot 32RB may move the substrate W into or out of the vessel part 110 through the opening 34C1.

In addition, the chamber member 34C may include at least one first suction part 34H1 and at least one second suction part 34H2. For instance, the first suction part 34H1 and the second suction part 34H2 may have the shape of a penetrating hole or a slit configured not to move the substrate W inside or outside and having a smaller cross-sectional part than the opening 34C1. Said differently, the first suction part 34H1 and the second suction part 34H2 may have a shape configured to introduce air from the transport chamber 32, but with a smaller cross-sectional area than the opening 34C1, leading to little effect on temperature effect.

As described above, the first suction part 34H1 may be provided at the same height as the second exhaust part 162. Furthermore, the second suction part 34H2 may be provided at the same height as the third exhaust part 163.

In addition, the first suction part 34H1 and the second suction part 34H2 may be provided in a position where they are spaced apart from the opening 34C1 in the vertical direction so as to get provided at a height different from that of the substrate treatment region 110S. The first suction part 34H1, the opening part 34C1, and the second suction part 34H2 may be provided in a vertical line.

Accordingly, the first suction part 34H1 and the second exhaust part 162 are disposed at the same height, and the second suction part 34H2 and the third exhaust part 163 are disposed at the same height and are provided in different positions from the opening 34C1 in the vertical direction. This makes it possible to ventilate a region other than the substrate treatment region 110S (i.e., upper and lower spaces of the substrate treatment region 110S), as well as to break a vacuum atmosphere while preventing congestion the airflow of the accommodation space of the chamber member 34C even if the shutter 34S is closed.

For instance, it is difficult for the chamber member 34C to have a fan filter unit in a position which blocks the opening 34C1. In addition, since the upper part of the vessel part 110 is blocked to form a sealed structure, the fan filter unit of the transport chamber 32 is difficult to provide on the upper part due to the structure. As described above, it is difficult for the supercritical chamber 34 to form a flow of the airflow using the fan filter unit of the transport chamber 32.

However, in the present embodiment, even when the shutter 34S is closed by forming the first suction part 34H1 and the second suction part 34H2, a horizontal airflow may be formed without any occurrence of a vacuum environment. Furthermore, in the present embodiment, it is possible to prevent a reverse flow formed opposite to the airflow from the opening 34C1 towards the first exhaust part 161.

For example, in a substrate treatment process in which the upper body 111 and the lower body 112 come in close contact with each other to seal the substrate treatment region 110S, the shutter 34S closes the opening 34C1, and the air (i.e., the external air of the chamber member 34C) of the transport chamber 32 which is introduced from the opened first and second suction parts 34H1 and 34H2 may be discharged to the outside along with the internal air of the accommodation space through one of the first exhaust part 161, the second exhaust part 162 and the third exhaust part 163.

The first suction part 34H1 and the second suction part 34H2 may prevent a reverse flow of air due to a pressure difference between the first exhaust part 161, the second exhaust part 162, and the third exhaust part 163 when the internal air is discharged from the accommodation space to the outside, and may prevent the formation of a vacuum. This will be described below with reference to FIG. 4.

The shutter 34S may open or close the opening 34C1 of the chamber member 34C. The shutter 34S may be provided with a door having at least the same area as the opening 34C1, and with a driving device (not shown) configured to drive the door. The driving device may be provided as an actuator, a linear motor, or a ball screw mechanism, identically or similarly to the first driving part 110MT described below. However, the present disclosure is not limited thereto.

The shutter 34S may open or close the opening 34C1 through a vertical sliding operation. During the opening or closing operation of the shutter 34S, the first suction part 34H1 and the second suction part 34H2 are not preferably blocked, but the present disclosure is not limited thereto, and other examples will be described below.

In addition, the shutter 34S closes the opening 34C1 when the substrate W is treated in the substrate treatment region 110S (which may be a supercritical treatment space) and opens the opening 34C1 when the substrate W moves inside or outside, thereby preventing or minimizing the temperature imbalance of the substrate treatment region 110S.

The substrate treating apparatus 100 in accordance with this embodiment can adjust the amount of inflow of the external air introduced from the outside of the chamber member 34C and the amount of exhaust of the internal air of the chamber member 34C. For example, the second exhaust part 162 and the third exhaust part 163 may be provided with dampers DP1 and DP2 configured to adjust a flow rate. Although this is not illustrated in the drawings, various modifications such a modification where a damper may be provided in the first exhaust part 161 may be possible.

The dampers DP1 and DP2 may be provided in a form where two plate members are overlapped, and the flow rate may be controlled by adjusting the part of overlapping penetrating holes formed in the two plate members. A known technique other than that can be applied, and the structure of the damper is not particularly limited.

Hereinafter, a flow of exhaust air according to an opening/closing operation of the shutter 34S will be described with reference to FIGS. 4 and 5.

Referring to FIG. 4, in a state in which the substrate W is treated, the substrate treatment region 110S (see FIG. 2) may be sealed. In order to avoid the temperature difference inside the accommodation space, the inflow of the fluid (which may be the external air based on the accommodation space) into the transport chamber 32 through the opening 34C1 may be blocked. This is to solve the following problems.

In order to perform supercritical drying, since the substrate treatment region 110S requires a pressure condition that exceeds a critical pressure, the substrate treatment region 110S may be sealed. Furthermore, since the temperature above the critical temperature has to be maintained, the heating member 150 may operate. In that case, the temperature of the accommodation space may have a temperature higher than room temperature due to the influence of the heating member 150. Accordingly, a temperature difference between the temperature of the transport chamber 32 at the room temperature and the accommodation space of the chamber member 34C may occur significantly (e.g., 20 degrees or more).

When the air of the transport chamber 32 is introduced into the accommodation space of the chamber member 34C1 through the opening 34C1, the temperature around the opening 34C1 may be different from the temperature around the first exhaust part 161 opposite to the opening 34C1. Then, the substrate treatment of the vessel part 110 adjacent to the opening 34C1 and the substrate treatment of the vessel part 110 adjacent to the first exhaust part 161 may cause the crowding and leaning of particles due to temperature imbalance. In order to prevent this problem, in the present embodiment, the shutter 34S closes the opening 34C1.

In other words, in the present embodiment, the shutter 34S can close the opening 34C1 during the substrate treatment to reduce the internal temperature difference in the accommodation space, thereby minimizing or preventing a problem caused by the temperature imbalance.

In addition, in the state where the shutter 34S closes the accommodation space, the first exhaust part 161 may perform an exhaust operation. In addition, the second exhaust part 162 and the third exhaust part 163 may perform an exhaust operation.

However, the exhaust pressure of each of the first exhaust part 161, the second exhaust part 162, and the third exhaust part 163 may be different. For instance, the exhaust pressure of each of the first exhaust part 161, the second exhaust part 162, and the third exhaust part 163 may be different due to a control, a pump specification, a pipe specification, and an exhaust amount difference. In the state where the accommodation space of the chamber member 34C is sealed, the exhaust by the first exhaust part 161, the second exhaust part 162, and the third exhaust part 163 may be performed, and when a difference occurs in each of the exhaust pressure, the reverse flow of the air may occur from a side having a large exhaust pressure (i.e., the third exhaust part 163) to a side having a small exhaust pressure (i.e., the first exhaust part 161 and the second exhaust part 162).

However, in the present embodiment, the first suction part 34H1 and the second exhaust part 162 face each other, the second suction part 34H2 and the third exhaust part 163 face each other, the airflow occurs from the first suction part 34H1 to the second exhaust part 162 (in the horizontal direction), and the airflow occurs from the second suction part 34H2 to the third exhaust part 163 (in the horizontal direction), thereby performing the function of the fan filter unit.

In addition, since the vacuum atmosphere of the accommodation space of the chamber member 34C may be broken by the first suction part 34H1 and the second suction part 34H2, the occurrence of the reverse flow can be prevented between the first exhaust part 161, the second exhaust part 162, and the third exhaust part 163. Therefore, it is possible to prevent the re-contamination of the particles due to the reverse flow of the airflow in the first exhaust part 161, the second exhaust part 162, and the third exhaust part 163.

Referring to FIG. 5, in a state where the treatment of the substrate W is completed and the substrate W is carried out, the substrate treatment region 110S may be opened. In that case, the shutter 34S may open the opening 34C1.

When the opening 34C1 is opened, the air (i.e., the external air of the accommodation space) of the transport chamber 32 may be exhausted through the first exhaust part 161 via the accommodation space of the chamber member 34C.

In addition, the first suction part 34H1 and the second suction part 34H2 are opened, and the external air introduced through the first suction part 34H1 and the second suction part 34H2 may be exhausted through the first exhaust part 161, the second exhaust part 162, and/or the third exhaust part 163.

The second exhaust part 162 and the third exhaust part 163 may be provided with the dampers DP1 and DP2, and the first exhaust part 161 may also be provided with a damper, and accordingly, the first exhaust part 161, the second exhaust part 162, and the third exhaust part 163 may always be in an exhaust state but can control the amount of exhaust.

For example, the exhaust amount of the first exhaust part 161, the second exhaust part 162, and the third exhaust part 163 can be adjusted in response to the inflow of the first suction part 34H1 and the second suction part 34H2 so as not to change the pressure of the accommodation space of the chamber member 34C before and after opening the shutter 34S. In other words, the inflow amount of the external air flowing into the accommodation space of the chamber member 34C can be equal to the exhaust amount of the air so that no pressure change may appear. When the pressure difference appears in the accommodation space of the chamber member 34C, a vortex may occur in the airflow, and in that case, the particles can be prevented from moving to the substrate W.

However, this is only an example. For another example, when the damper is not controlled so that the inflow amount is equal to the exhaust amount and the substrate treatment (a supercritical drying process) is completed, the shutter 34S is opened in advance (before the time when the pressure difference can be reduced), and the pressure change caused by the opening of the shutter 34S is stabilized with the substrate treatment region 110S closed, and then, the vessel part 110 may be opened. However, various other variations are possible.

Hereinafter, a modified example of the present embodiment will be described with reference to FIGS. 6 and 7, and redundant descriptions of the same configuration with the same function will be omitted.

FIG. 6 is a view illustrating the substrate treating apparatus according to a second embodiment of the present disclosure, and FIG. 7 is a view illustrating the substrate treating apparatus according to a third embodiment of the present disclosure. Referring to FIGS. 6 and 7, the differences from the content described using FIGS. 3 to 5 will be mainly described.

Referring to FIGS. 6 and 7, the substrate treating apparatus 100 of the second and third embodiments may include the chamber member 34C, the shutter 34S, the vessel part 110, the substrate support unit 120, the fluid supply unit 130, the exhaust unit 140, the heating member 150, the first exhaust part 161, the second exhaust part 162, the third exhaust part 163, and a clamping module 170, identically or similarly to the first embodiment.

However, there is a difference in that the shutter 34S of the first embodiment is formed of one door, while the shutter 34S of the second and third embodiments is formed of two doors and has the structure where the two doors are vertically separated and slidable. Herein, the sliding of the door may be performed by the driving devices such as the actuator and the linear motor identically or similarly to the first embodiment.

In addition, in the substrate treating apparatus 100 according to the second and third embodiments, the first exhaust part 161 exhausts while the substrate treatment region 110S and the shutter 34S are opened; however, the dampers DP1 and DP2 of the second exhaust part 162 and the third exhaust part 163 may be closed by adjusting an opening degree thereof according to the embodiment.

In addition, referring to FIG. 6, the first suction part 34H1 and the second suction part 34H2 of the second embodiment may be closed while the substrate treatment region 110S and the shutter 34S are opened.

On the other hand, as illustrated in FIG. 7, the first suction part 34H1 and the second suction part 34H2 of the third embodiment may be opened while the substrate treatment region 110S and the shutter 34S are opened, identically or similarly to the first embodiment.

In addition, as another embodiment is possible by coupling at least one of the substrate treating apparatus 100 of the first to third embodiments and the known techniques, various modifications are possible.

Although the embodiments of the present disclosure have been described above with reference to the accompanying drawings, the present disclosure is not limited to the disclosed embodiments, but may be implemented in various different ways, and the present disclosure may be embodied in many different forms without changing technical subject matters and essential features as will be understood by those skilled in the art. Therefore, embodiments set forth herein are exemplary only and not to be construed as a limitation.

DESCRIPTION OF THE REFERENCE SYMBOLS 1, 100: substrate treating apparatus
161: first exhaust part
162: second exhaust part
163: third exhaust part

What is claimed is:

1. A substrate treating apparatus, comprising:
a chamber member including an accommodation space and an opening configured to move a substrate into and out of the accommodation space, wherein a vessel part having a substrate treatment region formed for treating the substrate using a supercritical fluid is installed in the accommodation space;
a shutter configured to open or close the opening of the chamber member; and
a first exhaust part configured to discharge an internal air from the accommodation space to the outside;
a second exhaust part disposed adjacent to a first driving part configured to move one of the upper body and the lower body of the vessel part relative to the other body so as to open or close the substrate treatment region, and configured to exhaust an internal air around the first driving part to the outside, wherein the chamber member has a first suction part formed in a penetrating structure at a position separated from the opening, and regardless of whether the opening is opened or not, an external air introduced from the opened first suction part is discharged to the outside along with the internal air of the accommodation space through one of the first exhaust part and the second exhaust part; and
wherein during the treatment of the substrate using the supercritical fluid in the vessel part, the shutter closes the opening.

2. The substrate treating apparatus of claim 1, wherein the first exhaust part is provided to face the opening at the same height as the opening, and
the first suction part is disposed at the same height as the second exhaust part.

3. The substrate treating apparatus of claim 2, wherein the opening, the opened substrate treatment region, and the first exhaust part are provided in a line in the horizontal direction and are positioned at the same height.

4. The substrate treating apparatus of claim 2, wherein the first suction part is spaced apart from the opening in the vertical direction.

5. The substrate treating apparatus of claim 1, wherein at least one of the first exhaust part and the second exhaust part is provided with a damper configured to adjust a flow rate.

6. The substrate treating apparatus of claim 1, wherein the first suction part has the shape of penetrating hole or a slit configured not to move the substrate inside or outside and having a smaller cross-sectional part than the opening.

7. The substrate treating apparatus of claim 1, further comprising: a third exhaust part disposed adjacent to a second driving part configured to drive a clamp that clamps the circumference of the vessel part, and configured to exhaust an internal air around the second driving part to the outside.

8. The substrate treating apparatus of claim 7, wherein the chamber member has a second suction part formed at the same height as the third exhaust part, and
regardless of whether the opening is opened or not, an external air introduced from the opened second suction part is discharged to the outside along with the internal air of the accommodation space through one of the first exhaust part and the third exhaust part.

9. The substrate treating apparatus of claim 8, wherein the third exhaust part is provided with a damper configured to adjust a flow rate.

10. The substrate treating apparatus of claim 8, wherein the second suction part has the shape of a penetrating hole or a slit configured not to move the substrate inside or outside and having a smaller cross-sectional part than the opening.

11. A substrate treating apparatus, comprising: a transport chamber provided with a transport robot configured to carry in or out a substrate;
a chamber member disposed adjacent to the transport chamber, including an accommodation space and an opening configured to move the substrate into and out of the accommodation space, wherein a vessel part having a substrate treatment region formed for treating the substrate using a supercritical fluid is installed in the accommodation space;
a first driving part configured to move one of the upper and lower bodies of the vessel part relative to the other;
a first exhaust part configured to discharge an internal air from the accommodation space to the outside;
a second exhaust part disposed adjacent to the first driving part and configured to exhaust an internal air around the first driving part to the outside,
wherein the chamber member has a first suction part formed in the shape of a penetrating hole or a slit in a position spaced apart from the opening, and
regardless of whether the opening is opened or not, an external air introduced from the opened first suction part is discharged to the outside along with the internal air of the accommodation space through one of the first exhaust part and the second exhaust part; and
a shutter configured to open or close the opening of the chamber member;
wherein during the treatment of the substrate using the supercritical fluid in the vessel part, the shutter closes the opening.

12. The substrate treating apparatus of claim 11, further comprising: a wet treating chamber adjacent to the transport chamber and the chamber member and configured to treat a liquid film on the substrate,
wherein the liquid film includes isopropyl alcohol (IPA), and
the treating fluid forms a supercritical fluid and is then supplied, or forms the supercritical fluid by controlling pressure and temperature in the substrate treatment region.

13. The substrate treating apparatus of claim 11, wherein the first exhaust part is provided to face the opening at the same height as the opening, and the opening, the opened substrate treatment region, and the first exhaust part are provided in a line in the horizontal direction and are positioned at the same height, and the first suction part is disposed at the same height as the second exhaust part.

14. The substrate treating apparatus of claim 11, further comprising:

a clamping module including a clamp configured to clamp the circumference of the vessel part and a second driving part configured to drive a clamping release and a clamping operation of the clamp, and a third exhaust part disposed adjacent to the second driving part and configured to exhaust an internal air around the second driving part to the outside.

15. The substrate treating apparatus of claim 14, wherein the chamber member is provided at the same height as the third exhaust part and has a second suction part formed in the shape of a penetrating hole or a slit, regardless of whether the opening is opened or not, an external air introduced from the opened second suction part is discharged to the outside along with the internal air of the accommodation space through one of the first exhaust part and the third exhaust part, and at least one of the first exhaust part, the second exhaust part, and the third exhaust part is provided with a damper configured to adjust a flow rate.

16. The substrate treating apparatus of claim 15, wherein the first and second suction part are spaced apart from the opening in the vertical direction.

17. A substrate treating apparatus, comprising:

a transport chamber provided with a transport robot configured to carry in or out a substrate;

a chamber member disposed adjacent to the transport chamber, including an accommodation space and an opening configured to move the substrate into and out of the accommodation space, a vessel part provided in the accommodation space and having a substrate treatment region formed as a supercritical treatment space by coupling an upper body and a lower body of thereof;

a shutter configured to open or close the opening of the chamber member;

a fluid supply unit configured to supply a treating fluid to the substrate treatment region;

an exhaust unit configured to exhaust the treating fluid from the vessel part;

a first exhaust part configured to discharge an internal air from the accommodation space to the outside and face the opening and the substrate treatment region at the same height;

a first driving part configured to move one of the upper body and the lower body relative to the other body;

a second exhaust part disposed adjacent to the first driving part and configured to exhaust the internal air around the first driving part to the outside;

a clamping module including a clamp configured to clamp a circumference of the vessel part, and a second driving part configured to drive a clamping release and a clamping operation of the clamp;

a third exhaust part disposed adjacent to the second driving part and configured to exhaust the internal air around the second driving part to the outside, wherein the chamber member comprises:

a first suction part formed in the shape of a penetrating hole or a slit at the same height as the second exhaust part; and a second suction part formed in the shape of the penetrating hole or the slit at the same height as the third exhaust part, wherein the first suction part, the opening part and the second suction part are provided in a vertical line, the treating fluid forms a supercritical fluid in the fluid supply unit and is then supplied, or forms the supercritical fluid by controlling pressure and temperature in the substrate treatment region, and during the treatment of the substrate using the supercritical fluid in the vessel part, the shutter closes the opening, and an external air from the opened first and second suction parts is discharged to the outside along with the internal air of the accommodation space through one of the first exhaust part, the second exhaust part, and the third exhaust part.

* * * * *